United States Patent
Lee

(10) Patent No.: US 12,523,695 B2
(45) Date of Patent: Jan. 13, 2026

(54) SEMICONDUCTOR DEVICE INCLUDING BONDING PAD

(71) Applicant: SK hynix Inc., Gyeonggi-do (KR)

(72) Inventor: Hee Sun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 332 days.

(21) Appl. No.: 18/353,894

(22) Filed: Jul. 18, 2023

(65) Prior Publication Data

US 2024/0272224 A1 Aug. 15, 2024

(30) Foreign Application Priority Data

Feb. 10, 2023 (KR) ........................ 10-2023-0017854

(51) Int. Cl.
| | |
|---|---|
| G01R 31/28 | (2006.01) |
| H01L 23/00 | (2006.01) |
| H01L 25/065 | (2023.01) |
| H01L 25/18 | (2023.01) |
| H10B 80/00 | (2023.01) |

(52) U.S. Cl.
CPC .......... *G01R 31/2884* (2013.01); *H01L 24/05* (2013.01); *H01L 24/06* (2013.01); *H01L 24/08* (2013.01); *H01L 24/80* (2013.01); *H01L 25/0657* (2013.01); *H01L 25/18* (2013.01); *H01L 2224/05553* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/06181* (2013.01); *H01L 2224/08145* (2013.01); *H01L 2224/80357* (2013.01); *H01L 2224/80379* (2013.01); *H01L 2224/80895* (2013.01); *H01L 2224/80896* (2013.01); *H01L 2225/06596* (2013.01);
(Continued)

(58) Field of Classification Search
None
See application file for complete search history.

(56) References Cited

U.S. PATENT DOCUMENTS

| | | | |
|---|---|---|---|
| 8,648,615 B2* | 2/2014 | Rahman | H01L 25/0657 |
| | | | 324/754.01 |
| 2020/0381316 A1* | 12/2020 | Lee | H01L 25/18 |

(Continued)

FOREIGN PATENT DOCUMENTS

KR   10-2022-0030685 A   3/2022

*Primary Examiner* — Hung K Vu
(74) *Attorney, Agent, or Firm* — IP & T GROUP LLP

(57) ABSTRACT

A semiconductor device includes: a lower semiconductor structure including one or more first lower test pads, one or more second lower test pads that are alternately arranged with the one or more first lower test pads, and a lower test terminal that is electrically connected to the second lower test pad through a second lower test line; and an upper semiconductor structure positioned over the lower semiconductor structure and including an upper test pad and an upper test terminal that is electrically connected to the upper test pad through an upper test line, wherein, when the lower semiconductor structure and the upper semiconductor structure are aligned, the upper test pad overlaps with and contacts a corresponding first lower test pad among the one or more first lower test pads, and is spaced apart from the second lower test pad that is adjacent to the corresponding first lower test pad.

31 Claims, 6 Drawing Sheets

(52) U.S. Cl.
CPC ............... *H01L 2924/0504* (2013.01); *H01L 2924/0544* (2013.01); *H10B 80/00* (2023.02)

(56) References Cited

U.S. PATENT DOCUMENTS

2021/0066143 A1 * 3/2021 Jung .................. H01L 24/95
2022/0005775 A1   1/2022 Sheng et al.

* cited by examiner

SEMICONDUCTOR DEVICE INCLUDING BONDING PAD

CROSS-REFERENCE TO RELATED APPLICATIONS

The present application claims priority of Korean Patent Application No. 10-2023-0017854, filed on Feb. 10, 2023, which is incorporated herein by reference in its entirety.

BACKGROUND

1. Field

Various embodiments of the present disclosure relate to a semiconductor technology, and more particularly, to a semiconductor device including bonding pads.

2. Description of the Related Art

Electronic products are required to be capable of processing high-capacity data while getting smaller and smaller in their volume. Accordingly, semiconductor structures used in those electronic products, such as semiconductor chips and wafers, are also required to have a thin thickness and a small size. Furthermore, a form of embedding a plurality of semiconductor structures in one semiconductor device is being realized.

A plurality of semiconductor structures may be stacked in a vertical direction and electrically connected to each other using bonding pads.

SUMMARY

Embodiments of the present disclosure are directed to a semiconductor device capable of detecting the presence of misalignment between a lower semiconductor structure and an upper semiconductor structure and measuring the extent of the misalignment by forming a lower test pad and an upper test pad together with a lower bonding pad and an upper bonding pad, and using these test pads.

In accordance with an embodiment of the present disclosure, a semiconductor device includes: a lower semiconductor structure including one or more first lower test pads, one or more second lower test pads that are alternately arranged with the one or more first lower test pads, and a lower test terminal that is electrically connected to the second lower test pad through a second lower test line; and an upper semiconductor structure positioned over the lower semiconductor structure and including an upper test pad and an upper test terminal that is electrically connected to the upper test pad through an upper test line, wherein, when the lower semiconductor structure and the upper semiconductor structure are aligned, the upper test pad overlaps with and contacts a corresponding first lower test pad among the one or more first lower test pads, and is spaced apart from the second lower test pad that is adjacent to the corresponding first lower test pad.

In accordance with another embodiment of the present disclosure, a semiconductor device includes: a lower semiconductor structure including a first-side first lower test pad and a first-side second lower test pad that are positioned in a first region, a first-side second lower test terminal that is electrically connected to the first-side second lower test pad, a second-side first lower test pad and a second-side second lower test pad that are positioned in a second region, a second-side second lower test terminal that is electrically connected to the second-side second lower test pad, a third-side first lower test pad and a third-side second lower test pad that are positioned in a third region, a third-side second lower test terminal that is electrically connected to the third-side second lower test pad, a fourth-side first lower test pad and a fourth-side second lower test pad that are positioned in a fourth region, and a fourth-side second lower test terminal that is electrically connected to the fourth-side second lower test pad; and an upper semiconductor structure positioned over the lower semiconductor structure and including a first-side upper test pad, a second-side upper test pad, a third-side upper test pad, and a fourth-side upper test pad, and an upper test terminal that is electrically connected in common to the first-side to fourth-side upper test pads. When the lower semiconductor structure and the upper semiconductor structure are aligned, the first-side upper test pad, the second-side upper test pad, the third-side upper test pad, and the fourth-side upper test pad overlap with and contact the first-side first lower test pad, the second-side first lower test pad, the third-side first lower test pad, and the fourth-side first lower test pad, respectively, and are spaced apart from the first-side second lower test pad, the second-side second lower test pad, the third-side second lower test pad, and the fourth-side second lower test pad.

DETAILED DESCRIPTION

Figure 1:
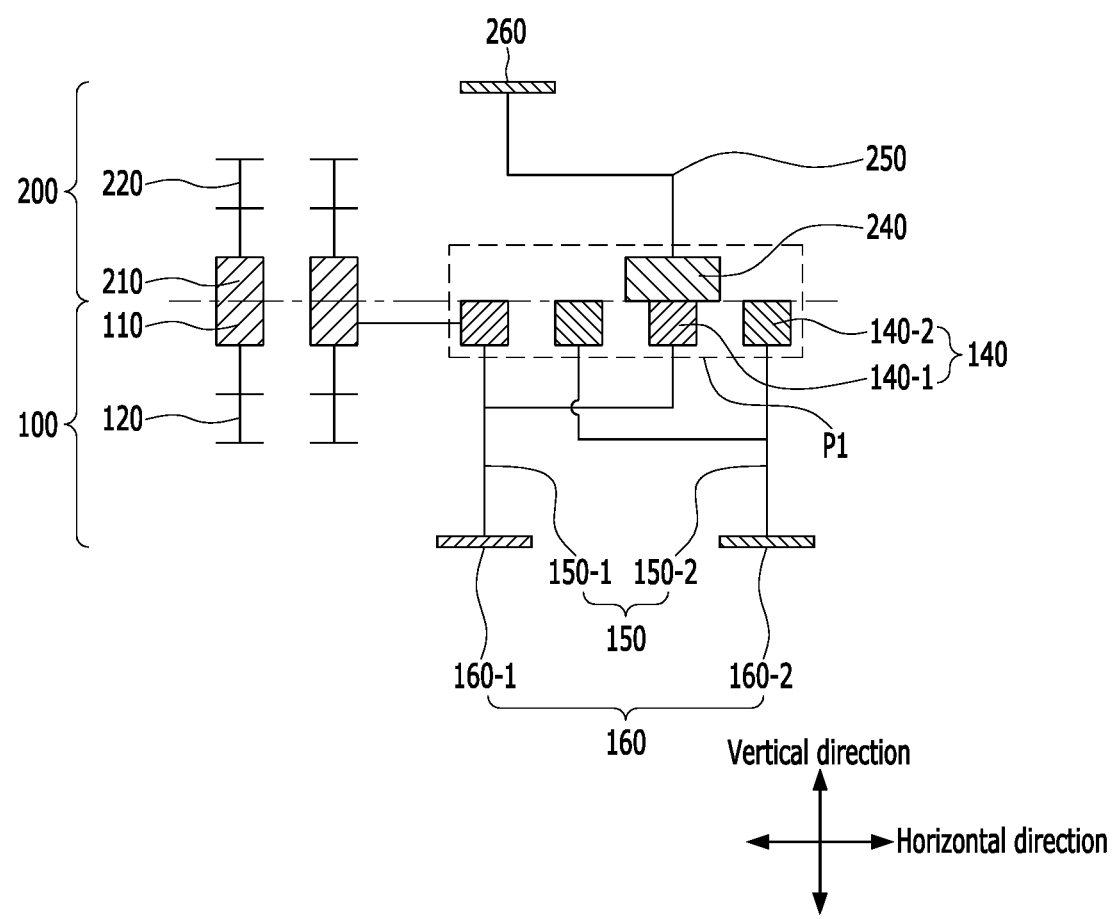
FIG. 1 is a cross-sectional view illustrating a semiconductor device in accordance with an embodiment of the present disclosure.

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure conveys the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following description, a semiconductor structure may mean a semiconductor wafer, a semiconductor chip and the like including an integrated circuit that performs a predetermined function. Also, a semiconductor device may include two or more semiconductor structures that are stacked in a vertical direction and electrically connected to each other. Electrical connection between semiconductor structures may be formed by bonding pads, and precise alignment between the semiconductor structures may be required to secure excellent electrical connection characteristics. Hereinafter, this will be described in more detail with reference to the accompanying drawings.

Figure 2:
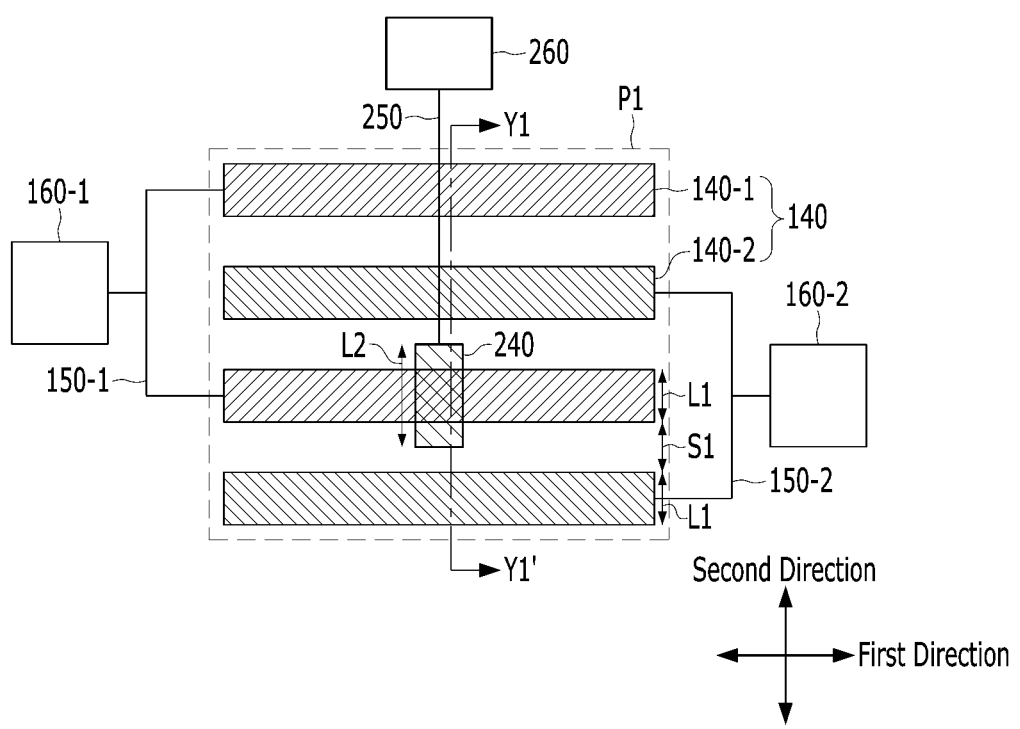
FIG. 2 is a plan view illustrating a portion P1 of FIG. 1.

FIG. 1 is a cross-sectional view illustrating a semiconductor device in accordance with an embodiment of the present disclosure, and FIG. 2 is a plan view illustrating a portion P1 of FIG. 1. The portion P1 of FIG. 1 may correspond to a cross section taken along a line Y1-Y1' shown in FIG. 2. Also, FIG. 2 shows test lines and test terminals that are connected to the portion P1 in addition to the portion P1 of FIG. 1.

Referring to FIGS. 1 and 2, a semiconductor device in accordance with an embodiment of the present disclosure may include a lower semiconductor structure 100, and an upper semiconductor structure 200 that is positioned over and electrically connected to the lower semiconductor structure 100. FIG. 1 shows a case where the lower semiconductor structure 100 and the upper semiconductor structure 200 are accurately aligned.

The lower semiconductor structure 100 may include a lower bonding pad 110, a lower integrated circuit 120, and a lower test structure 140, 150, and 160.

The lower integrated circuit 120 may be configured to perform predetermined functions, such as data storage and data processing by combining and electrically connecting diverse discrete elements. The lower integrated circuit 120 may be buried in a dielectric layer (not shown). The dielectric layer may provide support to the lower integrated circuit 120. Discrete elements of the lower integrated circuit 120 may include active elements, such as, for example, transistors, and passive elements, such as, for example, resistors, capacitors and the like. The lower integrated circuit 120 is schematically illustrated with vertical and horizontal lines, however, it should be understood that this is just a simplified illustration and that lower integrated circuit 120 may not be limited by this schematic. The lower integrated circuit 120 may be realized in any suitable way depending on the type of the lower semiconductor structure 100. For example, when the lower semiconductor structure 100 includes a volatile memory, such as a Dynamic Random Access Memory (DRAM), a Static RAM (SRAM) and the like, or a non-volatile memory, such as a NAND flash, a Resistive RAM (RRAM), a Phase-change RAM (PRAM), a Magneto-resistive RAM (MRAM), a Ferroelectric RAM (FRAM) and the like, the lower integrated circuit 120 may include a memory cell array including a plurality of memory cells. For example, when the lower semiconductor structure 100 is a logic chip or a controller, the lower integrated circuit 120 may include a peripheral circuit for driving a memory of the logic chip or the controller.

The lower bonding pad 110 may be electrically connected to the lower integrated circuit 120 and may be positioned over the lower integrated circuit 120. Also, the lower bonding pad 110 may be positioned on a top part of the lower semiconductor structure 100 with its top surface being bonded to an upper bonding pad 210' of the upper semiconductor structure 200. The lower bonding pad 110 may have its top surface exposed on the top surface of the lower semiconductor structure 100.

The lower test structure 140, 150 and 160 of the lower semiconductor structure 100 may, together with an upper test structure 240, 250 and 260 of the upper semiconductor structure 200, determine whether or not the lower and upper semiconductor structures 100 and 200 are accurately aligned. The lower test structure 140, 150 and 160 of the lower semiconductor structure 100 may, together with an upper test structure 240, 250 and 260 of the upper semiconductor structure 200, determine misalignment and when misalignment occurs, may determine the extent of the misalignment. The lower test structure 140, 150 and 160 may include a lower test pad 140, a lower test line 150, and a lower test terminal 160.

The lower test pad 140 may be formed at the same time with the lower bonding pad 110. In particular, the lower test pad 140 may be positioned at substantially the same level as the lower bonding pad 110 in the vertical direction. The lower test pad 140 and the lower bonding pad 110 may be formed of the same material. The lower test pad 140 and the lower bonding pad 110 may be formed to have the same or substantially the same thickness. The lower test pad 140 may have a bar shape or a shape similar to a bar shape having a relatively long length in a first direction and a relatively short length in a second direction. Referring to FIG. 2, the relatively short length of the lower test pad 140 in the second direction is represented by a reference symbol L1, which will be referred to as a first length L1, hereinafter. Herein, the first direction and the second direction may cross each other, and they may correspond to a horizontal direction. For example, the first direction and the second direction may be substantially perpendicular to each other.

The lower test pad 140 may include one or more first lower test pads 140-1 and one or more second lower test pads 140-2 that are spaced apart from each other and alternately arranged in the second direction. According to the illustrated embodiment, two first lower test pads 140-1 and two second lower test pads 140-2 may be alternately arranged in the second direction, however, the present invention is not limited by the number of the first and second lower test pads. The number of the first and second lower test pads 140-1 and 140-2 may vary. Adjacent first and second lower test pads 140-1 and 140-2 may be spaced apart by a first distance S1.

The lower test line 150 may be positioned at a level below the lower test pad 140 and may be electrically connected to the lower test pad 140. The lower test line 150 may include a first lower test line 150-1 electrically connected to the first lower test pad 140-1, and a second lower test line 150-2 electrically connected to the second lower test pad 140-2. The first lower test line 150-1 may be commonly connected to a plurality of, for example, two first lower test pads 140-1, and the second lower test line 150-2 may be commonly connected to a plurality of, for example, two second lower test pads 140-2. The first lower test line 150-1 and the second lower test line 150-2 may be electrically insulated from each other. Although FIG. 1 illustrates one first lower test line 150-1 and one second lower test line 150-2, it should be understood that the invention is not limited in this way and that a plurality of such lines may be employed.

Referring to the cross-sectional view, each of the first and second lower test lines 150-1 and 150-2 may be formed as a combination of a vertical conductive pattern, for example, a conductive via, and a horizontal conductive pattern, for example, a conductive line. For example, the first lower test line 150-1 may include two conductive vias that are respectively connected to two first lower test pads 140-1 and extending vertically downward from the two first lower test pads 140-1, a conductive line that extends in the horizontal direction while connecting the two conductive vias, and another conductive via that extends vertically downward from the conductive line. Also, for example, the second lower test line 150-2 may include two conductive vias that are respectively connected to two second lower test pads 140-2 and extending vertically downward from the two second lower test pads 140-2, a conductive line that extends in the horizontal direction while connecting the two conductive vias, and another conductive via that extends vertically downward from the conductive line. However, the concept and scope of the present disclosure are not limited to the illustrated one, and the shape of the first lower test line 150-1 and the shape of the second lower test line 150-2 may vary. Herein, for the sake of convenience in description, the first and second lower test lines 150-1 and 150-2 of the plan view are illustrated regardless of the positions and shapes of the first and second lower test lines 150-1 and 150-2 of the cross-sectional view.

The lower test terminal 160 may be electrically connected to the lower test line 150. The lower test terminal 160 may be positioned at a level below the lower test line 150. The lower test terminal 160 may be positioned opposite to the lower bonding pad 110 and the lower test pad 140, that is, at the lowermost portion of the lower semiconductor structure 100, for contact with an external device (not shown), for example, a test probe, and may have a lowermost surface (also referred to as a bottom surface) exposed on the lowermost surface of the lower semiconductor structure 100. Hence, the lowermost surface of the lower test terminal 160 may be coplanar with the lowermost surface of the lower semiconductor structure 100. The lower test terminal 160 may include a first lower test terminal 160-1 electrically connected to the first lower test line 150-1, and a second lower test terminal 160-2 electrically connected to the second lower test line 150-2. The first lower test terminal 160-1 and the second lower test terminal 160-2 may be electrically insulated from each other. In the figures, the first and second lower test terminals 160-1 and 160-2 are illustrated in a simplified schematic, hence their positioning and actual shape may vary without departing from the scope of the present disclosure.

All or part of the lower test line 150 may be formed at the same time with the lower integrated circuit 120. When a portion of the lower test line 150 from the lower bonding pad 110 is formed at the same time with the lower integrated circuit 120, the remainder extending to the lower test terminal 160 of the lower test line 150 may need to be formed additionally. The remainder may be formed separately from the lower integrated circuit 120 and may include, for example, a Through Silicon Via (TSV).

The upper semiconductor structure 200 may include an upper bonding pad 210, an upper integrated circuit 220, and an upper test structure 240, 250 and 260.

The upper integrated circuit 220 may be configured to perform predetermined functions, such as data storage and data processing, by a combination and electrical connection of diverse discrete elements, and may be buried and supported in a dielectric layer (not shown). The discrete elements may include active elements, such as transistors, and passive elements, such as resistors, capacitors and the like. For the sake of convenience in description, the upper integrated circuit 220 is briefly illustrated with vertical and horizontal lines, but the concept and scope of the present disclosure are not limited thereto, and the upper integrated circuit 220 may be diversely realized depending on the type of the upper semiconductor structure 200. For example, when the upper semiconductor structure 200 includes a volatile memory, such as a Dynamic Random Access Memory (DRAM), a Static RAM (SRAM) and the like, or a non-volatile memory, such as a NAND flash, a Resistive RAM (RRAM), a Phase-change RAM (PRAM), a Magneto-resistive RAM (MRAM), a Ferroelectric RAM (FRAM) and the like, the upper integrated circuit 220 may include a memory cell array including a plurality of memory cells. Also, for example, when the upper semiconductor structure 200 is a logic chip or a controller including a peripheral circuit for driving a memory, the upper integrated circuit 220 may include a peripheral circuit. The upper semiconductor structure 200 may include a memory which is the same as or different from the lower semiconductor structure 100. Alternatively, the lower semiconductor structure 100 may include a memory, and the upper semiconductor structure 200 may include a peripheral circuit for driving the memory. Alternatively, the upper semiconductor structure 200 may include a memory, and the lower semiconductor structure 100 may include a peripheral circuit for driving the memory.

The upper bonding pad 210 may be electrically connected to the upper integrated circuit 220 and disposed below the upper integrated circuit 220. Also, the upper bonding pad 210 may be positioned at the lowermost portion of the upper semiconductor structure 200 to be bonded to the lower bonding pad 110, and may have a lowermost surface exposed on the lowermost surface of the upper semiconductor structure 200.

The upper test structure 240, 250 and 260 may include an upper test pad 240, an upper test line 250, and an upper test terminal 260.

The upper test pad 240 may be formed at the same time with the upper bonding pad 210. Accordingly, the upper test pad 240 may be positioned at substantially the same level as the upper bonding pad 210 in the vertical direction and formed of substantially the same thickness and material. The upper test pad 240 may have a bar shape or a shape similar to a bar shape having a relatively long length in the second direction and a relatively short length in the first direction to cross the lower test pad 140. The length of the upper test pad 240 in the second direction is represented by a reference symbol L2, which will be referred to as a second length L2, hereinafter. The second length L2 may be longer than the first length L1.

When the lower semiconductor structure 100 and the upper semiconductor structure 200 are accurately aligned, the upper test pad 240 may overlap with and contact one first lower test pad 140-1, as illustrated. However, the concept and scope of the present disclosure are not limited thereto, and the upper test pad 240 may overlap with and contact one second lower test pad 140-2. Also, the upper test pad 240 may be spaced apart from the lower test pads 140 other than the first lower test pad 140-1 contacting the upper test pad 240. In other words, the upper test pad 240 may not contact the two neighboring second lower test pads 140-2. To this end, the second length L2 may have a value which is smaller than a value corresponding to the sum of the first length L1 and the first distance S1*2 (L1+S1*2). As described above, since the second length L2 is longer than the first length L1, the upper test pad 240 may have a portion that overlaps with the first lower test pad 140-1 contacting the upper test pad 240 and a portion protruding out of the first lower test pad 140-1 in the second direction. According to the present embodiment of the present disclosure, the central portion of the upper test pad 240 may overlap with and contact the first lower test pad 140-1 in the second direction, and the two edge portions positioned on both sides of the central portion may protrude out of the first lower test pad 140-1. The lengths of the two edge portions in the second direction may be substantially the same. However, in order to prevent the two edge portions from contacting the neighboring second lower test pad 140-2 in the second direction, the length of each of the two edge portions in the second direction may be smaller than the first distance S1.

The upper test line 250 may be electrically connected to the upper test pad 240 and disposed above the upper test pad 240. Referring to the cross-sectional view, the upper test line 250 may be formed as a combination of a vertical conductive pattern, e.g., a conductive via, a horizontal conductive pattern, and a conductive line. For example, the upper test line 250 may include a conductive via that is connected to the upper test pad 240 and extending vertically upward therefrom, a conductive line that extends in the horizontal direction from the conductive via toward an upper test terminal 260, which will be described later, and another conductive via that extends vertically upward from the conductive line toward the upper test terminal 260. However, the concept and scope of the present disclosure are not limited to the illustrated one, and the shape of the upper test line 250 may vary. For the sake of convenience in description, the upper test line 250 of the plan view is illustrated regardless of the shape of the upper test line 250 of the cross-sectional view.

The upper test terminal 260 may be electrically connected to the upper test line 250 over the upper test line 250. The upper test terminal 260 may be positioned on the opposite side of the upper bonding pad 210 and the upper test pad 240, that is, in the upper portion of the upper semiconductor structure 200, for contact with an external device (not shown), for example, a test probe, and may have a top surface that is exposed on the top surface of the upper semiconductor structure 200.

All or part of the upper test line 250 may be formed at the same time with the upper integrated circuit 220. When a portion of the upper test line 250 from the upper bonding pad 210 is formed at the same time with the upper integrated circuit 220, the remainder extending to the upper test terminal 260 of the upper test line 250 may need to be formed additionally. This remainder may be formed separately from the upper integrated circuit 220 and may include, for example, a TSV.

The lower semiconductor structure 100 and the upper semiconductor structure 200 described above may be electrically connected by a hybrid bonding method. To be specific, when a high-temperature annealing process is performed in a state that the lower bonding pad 110 and the upper bonding pad 210 are in direct contact, the lower bonding pad 110 and the upper bonding pad 210 may form a metal-to-metal junction by diffusion between a metal material forming the lower bonding pad 110 and a metal material forming the upper bonding pad 210. The metal material may include, for example, copper (Cu), nickel (Ni), tin (Sn), gold (Au), silver (Ag), a combination thereof, or a compound of these metals. In this process, the upper test pad 240 and the first lower test pad 140-1 contacting the upper test pad 240 may also form a metal-to-metal junction. Furthermore, a dielectric layer (not shown) between the lower bonding pad 110 and the lower test pad 140, that is, the uppermost dielectric layer of the lower semiconductor structure 100, may directly contact a dielectric layer (not shown) between the upper bonding pad 210 and the upper test pad 240, that is, the lowermost dielectric layer of the upper semiconductor structure 200, and an insulator-to-insulator junction may be formed by a covalent bonding between the dielectric materials during the annealing process. This dielectric material may include, for example, silicon oxide, silicon nitride, or a combination thereof.

A method for determining whether the lower and upper semiconductor structures 100 and 200 are aligned in the above semiconductor device, (also referred to as an overlay measurement method), is described with reference to FIGS. 2, 3 and 4.

FIG. 2 is a plan view illustrating a test structure when the lower semiconductor structure 100 and the upper semiconductor structure 200 are aligned. Also, FIGS. 3 and 4 are plan views illustrating a test structure when a lower semiconductor structure and an upper semiconductor structure are misaligned. For example, FIG. 3 shows a case where a short-failure (SF) in which the upper test pad 240 contacts the second lower test pad 140-2 that is positioned below the first lower test pad 140-1 that contacts the upper test pad 240 as the upper semiconductor structure moves toward one side of the second direction on a plane, for example, in the downward direction. FIG. 4 shows a case where the misalignment extent is greater than that of FIG. 3 as the upper semiconductor structure moves further in the downward direction on a plane.

For determining misalignment, the second lower test terminal 160-2 and the upper test terminal 260 may be used. For example, a current flow between the second lower test terminal 160-2 and the upper test terminal 260 may be detected.

In the case of FIG. 2, a current flow between the second lower test terminal 160-2 and the upper test terminal 260 may not occur. This is because the upper test pad 240 that is electrically connected to the upper test terminal 260 is separated from the second lower test pad 140-2 that is electrically connected to the second lower test terminal 160-2 and electrically blocked. Thus, in the case of FIG. 2, it may be determined that the lower semiconductor structure 100 and the upper semiconductor structure 200 are accurately aligned.

Figure 3:
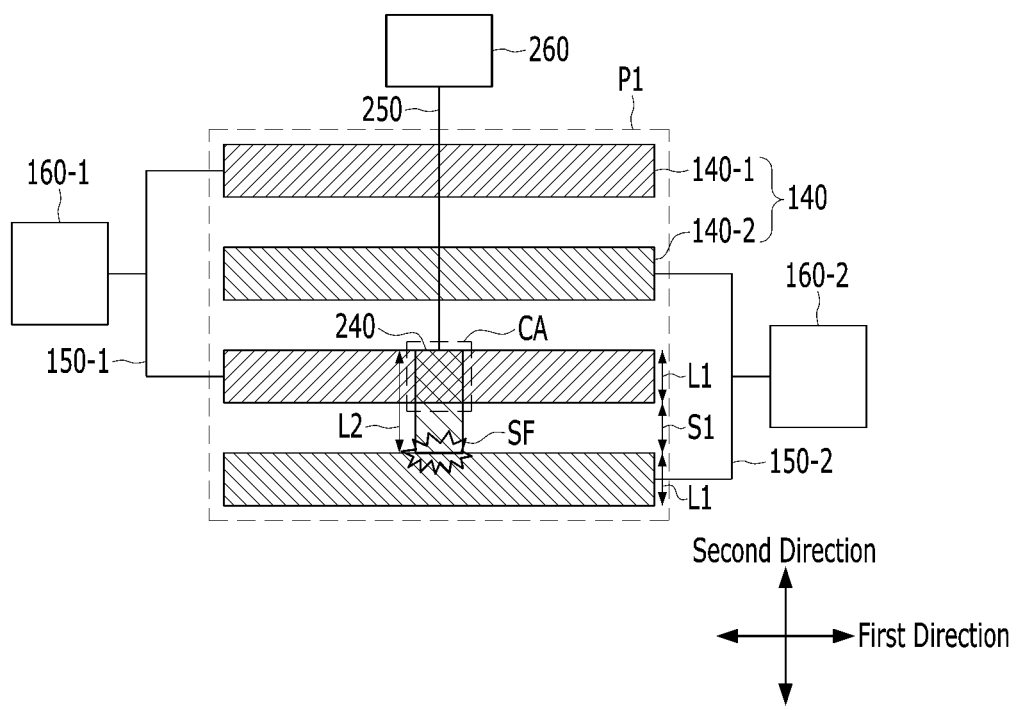
FIGS. 3 and 4 are plan views illustrating a test structure when a lower semiconductor structure and an upper semiconductor structure are misaligned.
Figure 4:
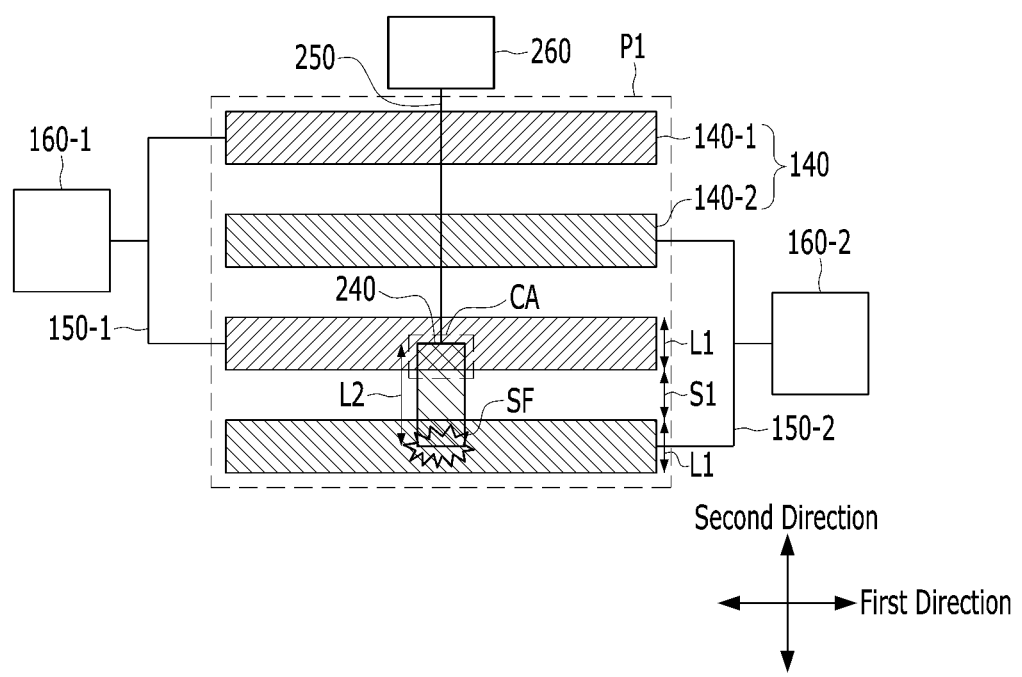

On the other hand, in the case of FIGS. 3 and 4, a current flow may occur between the second lower test terminal 160-2 and the upper test terminal 260. This is because the upper test pad 240 that is electrically connected to the upper test terminal 260 contacts and is electrically connected to the second lower test pad 140-2 that is electrically connected to the second lower test terminal 160-2. Thus, in the case of FIGS. 3 and 4, it may be determined that the lower semiconductor structure 100 and the upper semiconductor structure 200 are misaligned.

Furthermore, the misalignment extent may also be determined by using the first lower test terminal 160-1 and the upper test terminal 260, or by using the second lower test terminal 160-2 and the upper test terminal 260, or both.

In the case of using the first lower test terminal 160-1 and the upper test terminal 260, the amount of current flowing between them may be measured, and the misalignment extent may be measured by calculating a resistance value of a current path flowing between the first lower test terminal 160-1 and the upper test terminal 260 from the measured amount of current and the voltage applied to the first lower test terminal 160-1 and the upper test terminal 260. For example, a smaller calculated resistance value may mean that the contact area CA between the upper test pad 240 and the first lower test pad 140-1 is larger which in turn this means that a smaller misalignment extent.

In the case of using the second lower test terminal 160-2 and the upper test terminal 260, the amount of current flowing between them may be measured, and the misalignment extent may be measured by calculating a resistance value of a current path flowing between the second lower test terminal 160-2 and the upper test terminal 260 from the measured amount of current and the voltage applied to the second lower test terminal 160-2 and the upper test terminal 260. In this case, a smaller calculated resistance value means that the contact area between the upper test pad 240 and the second lower test pad 240-1 is larger, hence, a larger misalignment extent.

For example, compared to FIG. 4, in the case of FIG. 3, whereas the contact area CA between the upper test pad 240 and the first lower test pad 140-1 is relatively large because the downward movement of the upper test pad 240 is relatively small, the contact area between the upper test pad 240 and the second lower test pad 140-2 may be relatively small. Therefore, the resistance value of the current path flowing between the first lower test terminal 160-1 and the upper test terminal 260 is small, or the resistance value of the current path flowing between the second lower test terminal 160-2 and the upper test terminal 260 may be large. Accordingly, it may be determined that the misalignment extent may be relatively small.

On the other hand, compared to FIG. 3, in the case of FIG. 4, whereas the contact area CA between the upper test pad 240 and the first lower test pad 140-1 is relatively small because the lower movement of the upper test pad 240 is relatively large, the contact area between the upper test pad 240 and the second lower test pad 140-2 may be relatively large. Therefore, the resistance value of the current path flowing between the first lower test terminal 160-1 and the upper test terminal 260 may be large, or the resistance value of the current path flowing between the second lower test terminal 160-2 and the upper test terminal 260 may be small. Accordingly, it may be determined that the misalignment extent may be relatively large.

In FIGS. 3 and 4, the case where the upper semiconductor structure 200 shifts downward is described, but the concept and scope of the present disclosure are not limited thereto. According to another embodiment of the present disclosure, the upper semiconductor structure 200 may shift upward, and in this case, too, the method for determining misalignment and the method for measuring of the misalignment extent may be substantially the same as those described above.

According to the semiconductor device described above, the forming process may be facilitated by forming test pads and test lines together with pre-formed bonding pads and integrated circuits.

Also, it is possible to prevent diverse problems that may occur in a typical overlay measurement method using a beam from the very source, such as a problem of low reliability that may occur due to an increase in beam transmission thickness when the thickness of a semiconductor structure increases.

Also, there is an advantage in that not only the presence of misalignment but also the misalignment extent may be measured by using the first and second lower test pads that are alternately arranged, and the first and second lower test terminals that are electrically connected to the first and second lower test pads.

Furthermore, there is an advantage in that the area of the semiconductor device may be reduced because a separate space for forming test pads is not required. This is because the test pads may be formed using other previously formed pads, such as a Kelvin resistance measurement pad or a dummy pad. The above test structure may be formed by connecting test lines and test pads in substantially the same manner as described in the present embodiment of the present disclosure.

According to the illustrated embodiment of the present disclosure, it is possible to determine whether or not misalignment occurs in the second direction and the misalignment extent, but it is not possible to determine on which side the misalignment has occurred among both sides of the second direction, that is, the upper side or the lower side. Hereinafter, a test structure capable of determining on which side the misalignment has occurred among both sides of the second direction, that is, the upper side and the lower side, will be described with reference to FIG. 5.

Figure 5:
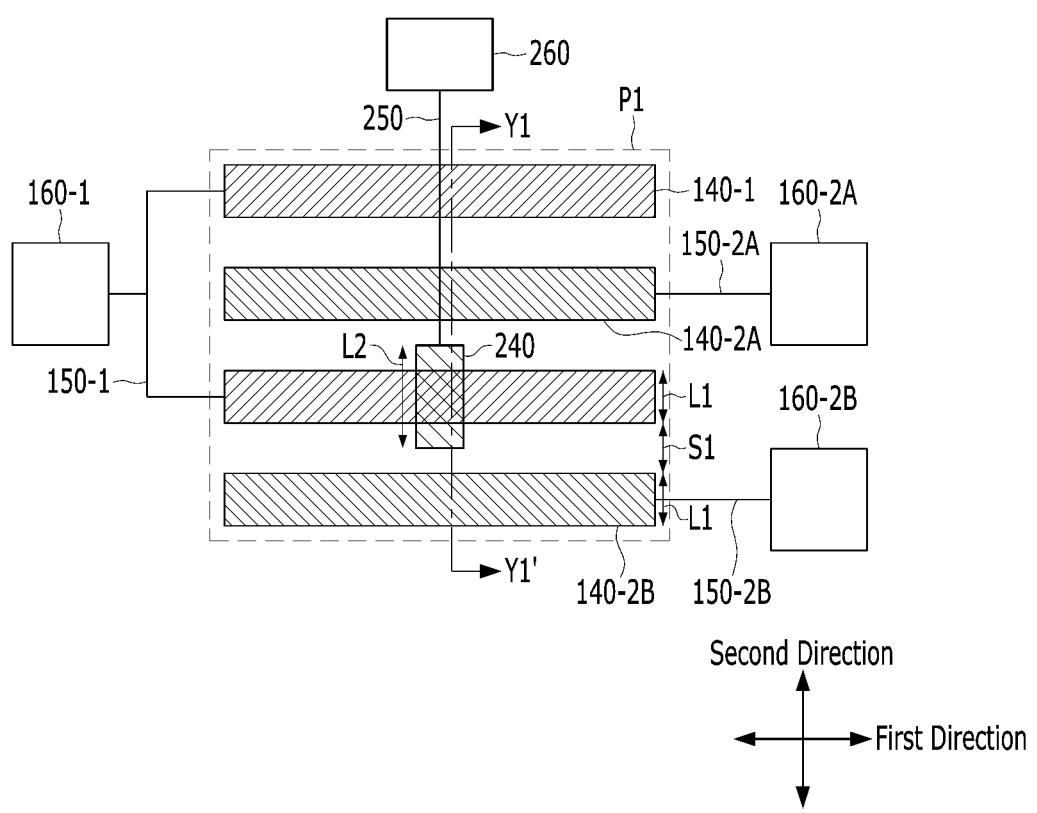
FIG. 5 is a plan view illustrating a semiconductor device in accordance with another embodiment of the present disclosure.

FIG. 5 is a plan view illustrating a semiconductor device in accordance with another embodiment of the present disclosure. In particular, FIG. 5 is a plan view illustrating a portion of a test structure. This drawing shows a case where the lower semiconductor structure and the upper semiconductor structure are accurately aligned. Differences from the above-described embodiment of the present disclosure will be mainly described.

Referring to FIG. 5, the semiconductor device according to the present embodiment of the present disclosure may include a lower semiconductor structure which includes two first lower test pads 140-1, two second lower test pads 140-2A and 140-2B that are alternately arranged with the two first lower test pads 140-1, two second lower test lines 150-2A and 150-2B that are respectively connected to the two second lower test pads 140-2A and 140-2B, and two second lower test terminals 160-2A and 160-2B that are respectively connected to the two second lower test lines 150-2A and 150-2B. The upper semiconductor structure may include an upper test pad 240, an upper test line 250, and an upper test terminal 260 in substantially the same manner as in the above-described embodiment of the present disclosure.

The two second lower test pads 140-2A and 140-2B may be referred to as a first-side second lower test pad 140-2A and a second-side second lower test pad 140-2B. The two second lower test lines 150-2A and 150-2B may be referred to as a first-side second lower test line 150-2A and a second-side second lower test line 150-2B. The two second lower test terminals 160-2A and 160-2B may be referred to as a first-side second lower test terminal 160-2A and a second-side second lower test terminal 160-2B. The electrical path formed by the first-side second lower test pad 140-2A, the first-side second lower test line 150-2A, and the first-side second lower test terminal 160-2A may be electrically blocked from the electrical path formed by the second-side second lower test pad 140-2B, the second-side second lower test line 150-2B, and the second-side second lower test terminal 160-2B.

An overlay measurement method in this structure will be described below.

For finding misalignment, a current flow between the first-side second lower test terminal 160-2A and the upper test terminal 260 and/or a current flow between the second-side second lower test terminal 160-2B and the upper test terminal 260 must be detected.

No current flow between the first-side second lower test terminal 160-2A and the upper test terminal 260 and no current flow between the second-side second lower test terminal 160-2B and the upper test terminal 260 indicate normal alignment.

In a case where misalignment occurs, the upper semiconductor structure may move downward so that the upper test pad 240 contacts the second-side second lower test pad 140-2B. As a result, a current will flow between the second-side second lower test terminal 160-2B and the upper test terminal 260. In this case, a current will not flow between the first-side second lower test terminal 160-2A and the upper test terminal 260.

In another example of misalignment, the upper semiconductor structure may move upward so that the upper test pad 240 contacts the first-side second lower test pad 140-2A, and as a result a current will flow between the first-side second lower test terminal 160-2A and the upper test terminal 260 may occur. However, in this case a current will not flow between the second-side second lower test terminal 160-2B and the upper test terminal 260.

Hence, this configuration of FIG. 5 allows determining on which side the misalignment occurs between the upper side and the lower side in the second direction.

When misalignment is detected, to measure the misalignment extent, the first lower test terminal 160-1 and the upper test terminal 260 may be used or the second lower test terminal 160-2 and the upper test terminal 260 may be used, which is the same as in the above-described embodiment of the present disclosure. Thus, detailed description on them will be omitted.

In the above-described embodiments of the present disclosure, the presence of misalignment in the second direction may be determined and the misalignment extent may be measured. The following embodiments of the present disclosure propose a semiconductor device capable of determining the presence of misalignment in the first direction and the second direction, that is, in all directions, and measuring the misalignment extent.

Figure 6:
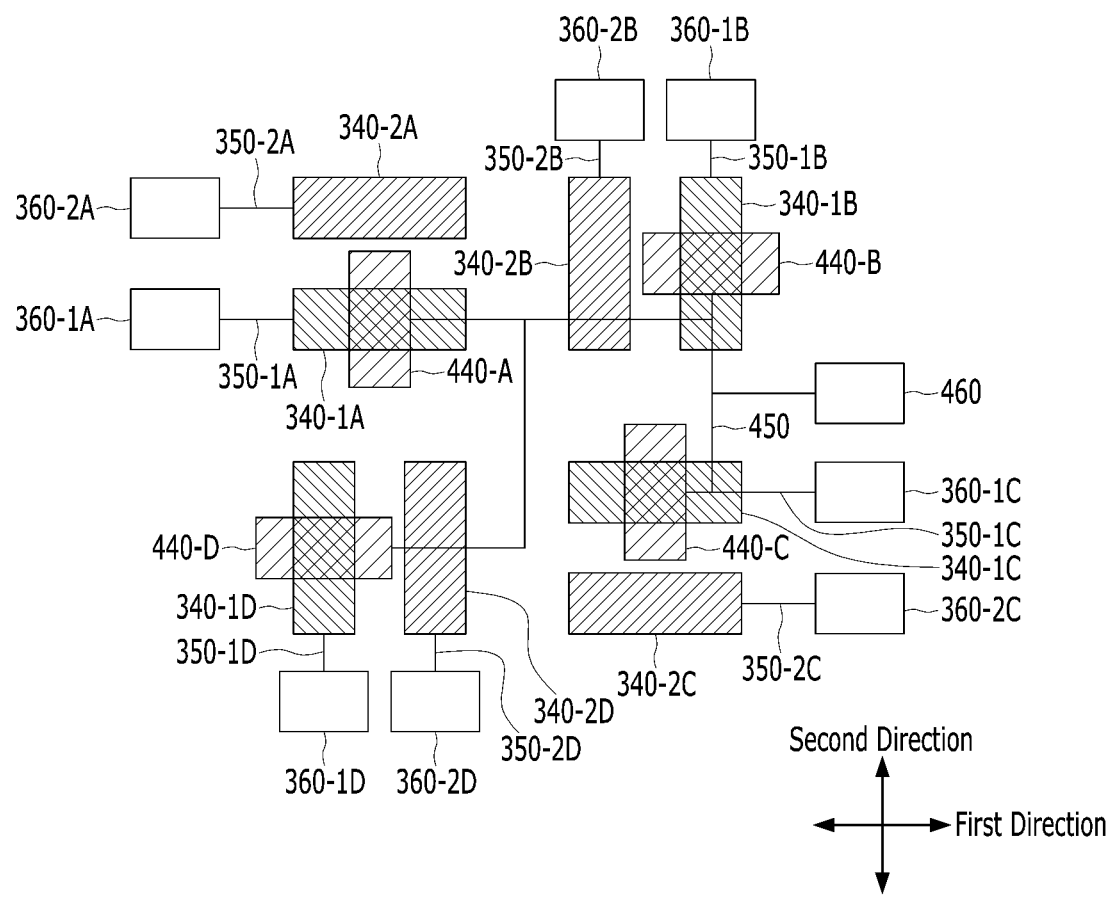
FIG. 6 is a plan view illustrating a semiconductor device in accordance with another embodiment of the present disclosure.

FIG. 6 is a plan view illustrating a semiconductor device in accordance with another embodiment of the present disclosure. In particular, FIG. 6 is a plan view illustrating a portion of a test structure. This drawing shows a case where the lower semiconductor structure and the upper semiconductor structure are accurately aligned. Differences from the above-described embodiment of the present disclosure will be mainly described.

Referring to FIG. 6, in the semiconductor device of this embodiment of the present disclosure, the lower semiconductor structure may include four first lower test pads 340-1A, 340-1B, 340-1C and 340-1D, four second lower test pads 340-2A, 340-2B, 340-2C and 340-2D, four first lower test lines 350-1A, 350-1B, 350-1C and 350-1D that are respectively connected to the four first lower test pads 340-1A, 340-1B, 340-1C and 340-1D, four second lower test lines 350-2A, 350-2B, 350-2C and 350-2D that are respectively connected to the four second lower test pads 340-2A, 340-2B, 340-2C and 340-2D, four first lower test terminals 360-1A, 360-1B, 360-1C and 360-1D that are respectively connected to the four first lower test lines 350-1A, 350-1B, 350-1C and 350-1D, and four second lower test terminals 360-2A, 360-2B, 360-2C and 360-2D that are respectively connected to the four second lower test lines 350-2A, 350-2B, 350-2C and 350-2D. Although not illustrated, the vertical-directional positions of these constituent elements of the lower semiconductor structure may be substantially the same as those described in FIG. 1.

For the sake of convenience in description, four regions obtained by dividing an area in the first direction and the second direction will be referred to as first to fourth regions. Although the present embodiment shows that the first to fourth regions are sequentially arranged in a clock-wise direction from the left side in the first direction and the upper side in the second direction, the concept and scope of the present disclosure are not limited thereto. The arrangement order of the first to fourth regions may be arbitrarily changed.

In this case, the first lower test pad 340-1A and the second lower test pad 340-2A corresponding to the first lower test pad 340-1A that are positioned in the first region may be referred to as a first-side first lower test pad 340-1A and a first-side second lower test pad 340-2A, respectively. Similarly, the first lower test pad 340-1B and the second lower test pad 340-2B corresponding to the first lower test pad 340-1B that are positioned in the second region may be referred to as a second-side first lower test pad 340-1B and a second-side second lower test pad 340-2B, respectively. The first lower test pad 340-1C and the second lower test pad 340-2C corresponding to the first lower test pad 340-1C that are positioned in the third region may be referred to as a third-side first lower test pad 340-1C and a third-side second lower test pad 340-2C, respectively. The first lower test pad 340-1D and the second lower test pad 340-2D corresponding to the first lower test pad 340-1D that are positioned in the fourth region may be referred to as a fourth-side first lower test pad 340-1D and a fourth-side second lower test pad 340-2D, respectively. The first-side first lower test pad 340-1A may be connected to the first-side first lower test terminal 360-1A through the first-side first lower test line 350-1A. The first-side second lower test pad 340-2A may be electrically connected to the first-side second lower test terminal 360-2A through the first-side second lower test line 350-2A. The second-side first lower test pad 340-1B may be connected to the second-side first lower test terminal 360-1B through the second-side first lower test line 350-1B. The second-side second lower test pad 340-2B may be electrically connected to the second-side second lower test terminal 360-2B through the second-side second lower test line 350-2B. The third-side first lower test pad 340-1C may be connected to the third-side first lower test terminal 360-1C through the third-side first lower test line 350-1C. The third-side second lower test pad 340-2C may be electrically connected to the third-side second lower test terminal 360-2C through the third-side second lower test line 350-2C. The fourth-side first lower test pad 340-1D may be connected to the fourth-side first lower test terminal 360-1D through the fourth-side first lower test line 350-1D. The fourth-side second lower test pad 340-2D may be electrically connected to the fourth-side second lower test terminal 360-2D through the fourth-side second lower test line 350-2D.

Each of the first-side first lower test pad 340-1A and the first-side second lower test pad 340-2A may have a bar shape or a shape similar to a bar shape which has a relatively long length in the first direction, that is, a long side, and a relatively short side in the second direction, that is, a short side. The first-side first lower test pad 340-1A and the first-side second lower test pad 340-2A may be positioned to be spaced apart from each other in the second direction and have their long sides face each other. Similarly, each of the third-side first lower test pad 340-1C and the third-side second lower test pad 340-2C may have a bar shape or a shape similar to a bar shape which has a relatively long length in the first direction and a relatively short side in the second direction. The third-side first lower test pad 340-1C and the third-side second lower test pad 340-2C may be positioned to be spaced apart from each other in the second direction and have their long sides face each other. However, the relative positions of the first-side first lower test pad 340-1A and the first-side second lower test pad 340-2A in the second direction and the relative positions of the third-side first lower test pad 340-1C and the third-side second lower test pad 340-2C in the second direction may be opposite to each other. For example, as illustrated, when the first-side first lower test pad 340-1A is positioned below the first-side second lower test pad 340-2A, the third-side first lower test pad 340-1C may be positioned above the third-side second lower test pad 340-2C, or vice versa.

Each of the second-side first lower test pad 340-1B and the second-side second lower test pad 340-2B may have a bar shape or a shape similar to a bar shape which has a relatively short length in the first direction and a relatively long side in the second direction. The second-side first lower test pad 340-1B and the second-side second lower test pad 340-2B may be positioned to be spaced apart from each other in the first direction and have their long sides face each other. Similarly, each of the fourth-side first lower test pad 340-1D and the fourth-side second lower test pad 340-2D may have a bar shape or a shape similar to a bar shape which has a relatively short length in the first direction and a relatively long side in the second direction. The fourth-side first lower test pad 340-1D and the fourth-side second lower test pad 340-2D may be positioned to be spaced apart from each other in the first direction and have their long sides face each other. However, the relative positions of the second-side first lower test pad 340-1B and the second-side second lower test pad 340-2B in the first direction, and the relative positions of the fourth-side first lower test pad 340-1D and the fourth-side second lower test pad 340-2D in the first direction may be opposite to each other. For example, as illustrated, when the second-side first lower test pad 340-1B is positioned on the right side of the second-side second lower test pad 340-2B, the fourth-side first lower test pad 340-1D may be positioned on the left side of the fourth-side second lower test pad 340-2D, or vice versa.

The upper semiconductor structure may include four upper test pads 440-A, 440-B, 440-C and 440-D, an upper test line 450 that are connected in common to the four upper test pads 440-A, 440-B, 440-C and 440-D, and an upper test terminal 460 that is connected to the upper test line 450. Although not illustrated, the vertical positions of these constituent elements of the upper semiconductor structure may be substantially the same as those described in FIG. 1.

The first-side upper test pad 440-A may be spaced apart from the first-side second lower test pad 340-2A while overlapping with and contacting the first-side first lower test pad 340-1A. The first-side upper test pad 440-A may have a bar shape or a shape similar to a bar shape which has a relatively long length in the second direction, that is, a long side, and a relatively short side in the first direction, that is, a short side, to cross the first-side first lower test pad 340-1A. In the second direction, the first-side upper test pad 440-A may have a portion overlapping with the first-side first lower test pad 340-1A and a portion protruding out of the portion. According to the embodiment of the present disclosure, the central portion of the first-side upper test pad 440-A may overlap with and contact the first-side first lower test pad 340-1A in the second direction, and the two edge portions positioned on both sides of the central portion may protrude outward from the first-side first lower test pad 340-1A. The lengths of the two edge portions in the second direction may be substantially the same. However, in order to prevent the edge portion of the two edge portions toward the first-side second lower test pad 340-2A from contacting it, the length of the edge portion in the second direction may be smaller than the gap between the first-side first lower test pad 340-1A and the first-side second lower test pad 340-2A.

The second-side upper test pad 440-B may be spaced apart from the second-side second lower test pad 340-2B while overlapping with and contacting the second-side first lower test pad 340-1B. The second-side upper test pad 440-B may have a bar shape or a shape similar to a bar shape which has a relatively short length in the second direction and a relatively long side in the first direction to cross the second-side first lower test pad 340-1B. In the first direction, the second-side upper test pad 440-B may have a portion overlapping with the second-side first lower test pad 340-1B and a portion protruding out of the portion. According to the embodiment of the present disclosure, the central portion of the second-side upper test pad 440-B may overlap with and contact the second-side first lower test pad 340-1B in the first direction, and the two edge portions positioned on both sides of the central portion may protrude outward from the second-side first lower test pad 340-1B. The lengths of the two edge portions in the first direction may be substantially the same. However, in order to prevent the edge portion of the two edge portions facing the second-side second lower test pad 340-2B from contacting the second-side second lower test pad 340-2B, the length of the edge portion in the first direction may be smaller than the gap between the second-side first lower test pad 340-1B and the second-side second lower test pad 340-2B.

The third-side upper test pad 440-C may be spaced apart from the third-side second lower test pad 340-2C while overlapping with and contacting the third-side first lower test pad 340-1C. The third-side upper test pad 440-C may have a bar shape or a shape similar to a bar shape which has a relatively long length in the second direction and a relatively short side in the first direction to cross the third-side first lower test pad 340-1C. In the second direction, the third-side upper test pad 440-C may have a portion overlapping with the third-side first lower test pad 340-1C and a portion protruding out of the portion. According to the embodiment of the present disclosure, the central portion of the third-side upper test pad 440-C may overlap with and contact the third-side first lower test pad 340-1C in the second direction, and the two edge portions positioned on both sides of the central portion may protrude outward from the third-side first lower test pad 340-1C. The lengths of the two edge portions in the second direction may be substantially the same. However, in order to prevent the edge portion of the two edge portions toward the third-side second lower test pad 340-2C from contacting it, the length of the edge portion in the second direction may be smaller than the gap between the third-side first lower test pad 340-1C and the third-side second lower test pad 340-2C.

The fourth-side upper test pad 440-D may be spaced apart from the fourth-side second lower test pad 340-2D while overlapping with and contacting the fourth-side first lower test pad 340-1D. The fourth-side upper test pad 440-D may have a bar shape or a shape similar to a bar shape which has a relatively short length in the second direction and a relatively long side in the first direction to cross the fourth-side first lower test pad 340-1D. In the first direction, the fourth-side upper test pad 440-D may have a portion overlapping with the fourth-side first lower test pad 340-1D and a portion protruding out of the fourth-side first lower test pad 340-1D. According to the embodiment of the present disclosure, the central portion of the fourth-side upper test pad 440-D may overlap with and contact the fourth-side first lower test pad 340-1D in the first direction, and the two edge portions positioned on both sides of the central portion may protrude outward from the fourth-side first lower test pad 340-1D. The lengths of the two edge portions in the first direction may be substantially the same. However, in order to prevent the edge portion of the two edge portions toward the fourth-side second lower test pad 340-2D from contacting it, the length of the edge portion in the first direction may be smaller than the gap between the fourth-side first lower test pad 340-1D and the fourth-side second lower test pad 340-2D.

An overlay measurement method in this structure may be described below.

In order to determine the presence of misalignment and the direction of the misalignment, a current flow between the first-side second lower test terminal 360-2A and the upper test terminal 460 (which is, hereinafter, referred to as a first current flow), a current flow between the second-side second lower test terminal 360-2B and the upper test terminal 460 (which is, hereinafter, referred to as a second current flow), a current flow between the third-side second lower test terminal 360-2C and the upper test terminal 460 (which is, hereinafter, referred to as a third current flow), and a current flow between the fourth-side second lower test terminal 360-2D and the upper test terminal 460 (which is, hereinafter, referred to as a fourth current flow) may be detected.

In the case of normal alignment, all of the first to fourth current flows may not occur.

As a case where misalignment occurs, when the upper semiconductor structure moves to one side of the second direction, for example, upward, and the first-side upper test pad 440-A contacts the first-side second lower test pad 340-2A, the first current flow may occur but the second to fourth current flows may not occur. As a result, misalignment may occur and, in particular, it may be determined that the upper semiconductor structure has moved upward with respect to the lower semiconductor structure.

In an example where misalignment occurs, when the upper semiconductor structure moves to one side of the first direction, for example, to the left, and the second-side upper test pad 440-B contacts the second-side second lower test pad 340-2B, the second current flow may occur but the first current flow, the third current flow, and the fourth current flow may not occur. As a result, misalignment has occurred, and in particular, it may be determined that the upper semiconductor structure has moved to the left with respect to the lower semiconductor structure.

In an example where misalignment occurs, when the upper semiconductor structure moves to another side of the second direction, for example, to the lower side, and the third-side upper test pad 440-C contacts the third-side second lower test pad 340-2C, the third current flow may occur but the first current flow, the second current flow, and the fourth current flow may not occur. As a result, misalignment has occurred, and in particular, it may be determined that the upper semiconductor structure has moved downward with respect to the lower semiconductor structure.

In an example where misalignment occurs, when the upper semiconductor structure moves to another side of the first direction, for example, to the right, and the fourth-side upper test pad 440-D contacts the fourth-side second lower test pad 340-2D, the fourth current flow may occur, but the first to third current flows may not occur. As a result, misalignment has occurred, and in particular, it may be determined that the upper semiconductor structure has moved to the right with respect to the lower semiconductor structure.

Also, the directions of misalignment may be diversely combined, and thus two or more among the first to fourth current flows may occur. For example, when the upper semiconductor structure moves downward and to the right, third and fourth current flows may occur.

As a result, it is possible to determine whether misalignment has occurred or not, and when misalignment occurs, the direction of the misalignment may be determined among the left side or right side in the first direction and the upper side or lower side in the second direction.

Also, when misalignment occurs, to measure the extent of the misalignment, the first lower test terminals 360-1A, 360-1B, 360-1C and 360-1D and the upper test terminal 460 may be used, or the second lower test terminals 360-2A, 360-2B, 360-2C and 360-2D and the upper test terminal 460 may be used, or both may be used.

As a case where misalignment occurs, when the first current flow occurs, the amount of current flowing between the first-side first lower test terminal 360-1A and the upper test terminal 460 may be measured, and the misalignment extent may be measured by calculating a resistance value of a current path flowing between the first-side first lower test terminal 360-1A and the upper test terminal 460 from the measured amount of current and the voltage applied to the first-side first lower test terminal 360-1A and the upper test terminal 460. A smaller resistance value means that the contact area between the first-side upper test pad 440-A and the first-side first lower test pad 340-1A is larger, which may mean that the misalignment extent is small. Similarly, the amount of current flowing between the first-side second lower test terminal 360-2A and the upper test terminal 460 may be measured, and the misalignment extent may be measured by calculating a resistance value of a current path flowing between the first-side second lower test terminal 360-2A and the upper test terminal 460 from the measured amount of current and the voltage applied to the first-side second lower test terminal 360-2A and the upper test terminal 460. A smaller resistance value means that the contact area between the first-side upper test pad 440-A and the first-side second lower test pad 340-2A is larger, which may mean that the misalignment extent is greater.

In an example where misalignment occurs, when the second current flow occurs, the amount of current flowing between the second-side first lower test terminal 360-1B and the upper test terminal 460 may be measured, and the misalignment extent may be measured by calculating a resistance value of a current path flowing between the second-side first lower test terminal 360-1B and the upper test terminal 460 from the measured amount of current and the voltage applied to the second-side first lower test terminal 360-1B and the upper test terminal 460. A smaller resistance value means that the contact area between the second-side upper test pad 440-B and the second-side first lower test pad 340-1B is larger, which means a smaller misalignment extent. Similarly, the amount of current flowing between the second-side second lower test terminal 360-2B and the upper test terminal 460 may be measured, and the misalignment extent may be measured by calculating a resistance value of a current path flowing between the second-side second lower test terminal 360-2B and the upper test terminal 460 from the measured amount of current and the voltage applied to the second-side second lower test terminal 360-2B and the upper test terminal 460. A smaller resistance value means that the contact area between the second-side upper test pad 440-B and the second-side second lower test pad 340-2B is larger, which may mean that the misalignment extent is greater.

In an example where misalignment occurs, when the third current flow occurs, the amount of current flowing between the third-side first lower test terminal 360-1C and the upper test terminal 460 may be measured, and the misalignment extent may be measured by calculating a resistance value of a current path flowing between the third-side first lower test terminal 360-1C and the upper test terminal 460 from the measured amount of current and the voltage applied to the third-side first lower test terminal 360-1C and the upper test terminal 460. A smaller resistance value means that the contact area between the third-side upper test pad 440-C and the third-side first lower test pad 340-1C is larger, which means a smaller misalignment extent. Similarly, the amount of current flowing between the third-side second lower test terminal 360-2C and the upper test terminal 460 may be measured, and the misalignment extent may be measured by calculating a resistance value of a current path flowing between the third-side second lower test terminal 360-2C and the upper test terminal 460 from the measured amount of current and the voltage applied to the third-side second lower test terminal 360-2C and the upper test terminal 460. A smaller resistance value means that the contact area between the third-side upper test pad 440-C and the third-side second lower test pad 340-2C is larger, which may mean that the misalignment extent is greater.

In an example where misalignment occurs, when the fourth current flow occurs, the amount of current flowing between the fourth-side first lower test terminal 360-1D and the upper test terminal 460 may be measured, and the misalignment extent may be measured by calculating a resistance value of a current path flowing between the fourth-side first lower test terminal 360-1D and the upper test terminal 460 from the measured amount of current and the voltage applied to the fourth-side first lower test terminal 360-1D and the upper test terminal 460. A smaller resistance value means that the contact area between the fourth-side upper test pad 440-D and the fourth-side first lower test pad 340-1D is larger, which means a smaller misalignment extent. Similarly, the amount of current flowing between the fourth-side second lower test terminal 360-2D and the upper test terminal 460 may be measured, and the misalignment extent may be measured by calculating a resistance value of a current path flowing between the fourth-side second lower test terminal 360-2D and the upper test terminal 460 from the measured amount of current and the voltage applied to the fourth-side second lower test terminal 360-2D and the upper test terminal 460. A smaller resistance value means that the contact area between the fourth-side upper test pad 440-D and the fourth-side second lower test pad 340-2D is larger, which may mean that the misalignment extent is greater.

According to the embodiment of the present disclosure, provided is a semiconductor device capable of detecting the presence of misalignment between a lower semiconductor structure and an upper semiconductor structure and measuring the extent of the misalignment by forming a lower test pad and an upper test pad together with a lower bonding pad and an upper bonding pad, and using these test pads.

While the present disclosure has been described with respect to the specific embodiments, it will be apparent to those skilled in the art that various changes and modifications may be formed without departing from the spirit and scope of the invention as defined in the following claims.

What is claimed is:

1. A semiconductor device, comprising:
   a lower semiconductor structure including one or more first lower test pads, one or more second lower test pads that are alternately arranged with the one or more first lower test pads, and a lower test terminal that is electrically connected to the second lower test pad through a second lower test line; and
   an upper semiconductor structure positioned over the lower semiconductor structure and including an upper test pad and an upper test terminal that is electrically connected to the upper test pad through an upper test line,
   wherein, when the lower semiconductor structure and the upper semiconductor structure are aligned, the upper test pad overlaps with and contacts a corresponding first lower test pad among the one or more first lower test pads, and is spaced apart from the second lower test pad that is adjacent to the corresponding first lower test pad.

2. The semiconductor device of claim 1, wherein, when the lower semiconductor structure and the upper semiconductor structure are aligned, the upper test pad protrudes more than the corresponding first lower test pad while crossing the corresponding first lower test pad.

3. The semiconductor device of claim 1, wherein each of the first lower test pad and the second lower test pad has a shape whose length in a first direction is longer than a length in a second direction crossing the first direction, and
   the first lower test pad and the second lower test pad are alternately arranged in the second direction.

4. The semiconductor device of claim 3, wherein the upper test pad has a shape whose length in the second direction is longer than a length in the first direction, and
   the length of the upper test pad in the second direction is longer than the length of each of the first and second lower test pads in the second direction.

5. The semiconductor device of claim 1, wherein, when the lower semiconductor structure and the upper semiconductor structure are aligned, a current flow does not occur between the lower test terminal and the upper test terminal.

6. The semiconductor device of claim 1, wherein, when the lower semiconductor structure and the upper semiconductor structure are misaligned, the upper test pad contacts the second lower test pads that is adjacent to the corresponding first lower test pad.

7. The semiconductor device of claim 1, wherein, when the lower semiconductor structure and the upper semiconductor structure are misaligned, a current flow occurs between the lower test terminal and the upper test terminal.

8. The semiconductor device of claim 1, wherein a current flow is detected between the lower test terminal and the upper test terminal in order to determine whether the lower semiconductor structure and the upper semiconductor structure are aligned or not.

9. The semiconductor device of claim 8, wherein, when the lower semiconductor structure and the upper semiconductor structure are determined to be misaligned, a resistance of a path of a current flowing between the lower test terminal and the upper test terminal is calculated.

10. The semiconductor device of claim 9, wherein, when the resistance is decreased, an extent of misalignment between the lower semiconductor structure and the upper semiconductor structure is increased.

11. The semiconductor device of claim 8, wherein the lower semiconductor structure further includes a first lower test terminal that is electrically connected to the first lower test pad through a first lower test line, and
   when the lower semiconductor structure and the upper semiconductor structure are determined to be misaligned, a resistance of a path of a current flowing between the first lower test terminal and the upper test terminal is calculated.

12. The semiconductor device of claim 11, wherein, when the resistance is decreased, an extent of misalignment between the lower semiconductor structure and the upper semiconductor structure is decreased.

13. The semiconductor device of claim 1, wherein the lower semiconductor structure further includes a first lower test terminal that is electrically connected to the first lower test pad through a first lower test line, and
when there are a plurality of first lower test pads, the first lower test line is commonly connected to the plurality of first lower test pads.

14. The semiconductor device of claim 1, wherein when there are a plurality of second lower test pads, the second lower test line is commonly connected to the plurality of second lower test pads.

15. The semiconductor device of claim 1, wherein, when the second lower test pad includes a first-side second lower test pad and a second-side second lower test pad that are respectively positioned on both sides of the corresponding first lower test pad, the lower test terminal includes a first-side lower test terminal and a second-side lower test terminal that are electrically connected to the first-side second lower test pad and the second-side second lower test pad, respectively.

16. The semiconductor device of claim 15, wherein, when the lower semiconductor structure and the upper semiconductor structure are misaligned and the upper semiconductor pad contacts the first-side second lower test pad, a current flow occurs between the first-side lower test terminal and the upper test terminal.

17. The semiconductor device of claim 15, wherein, when the lower semiconductor structure and the upper semiconductor structure are misaligned and the upper semiconductor pad contacts the second-side second lower test pad, a current flow occurs between the second-side lower test terminal and the upper test terminal.

18. The semiconductor device of claim 15, wherein, in order to determine whether the lower semiconductor structure and the upper semiconductor structure are aligned or not, a current flow between the first-side lower test terminal and the upper test terminal and a current flow between the second-side lower test terminal and the upper test terminal are detected.

19. A semiconductor device, comprising:
a lower semiconductor structure including
a first-side first lower test pad and a first-side second lower test pad that are positioned in a first region,
a first-side second lower test terminal that is electrically connected to the first-side second lower test pad,
a second-side first lower test pad and a second-side second lower test pad that are positioned in a second region,
a second-side second lower test terminal that is electrically connected to the second-side second lower test pad,
a third-side first lower test pad and a third-side second lower test pad that are positioned in a third region,
a third-side second lower test terminal that is electrically connected to the third-side second lower test pad,
a fourth-side first lower test pad and a fourth-side second lower test pad that are positioned in a fourth region, and
a fourth-side second lower test terminal that is electrically connected to the fourth-side second lower test pad; and
an upper semiconductor structure positioned over the lower semiconductor structure and including a first-side upper test pad, a second-side upper test pad, a third-side upper test pad, and a fourth-side upper test pad, and an upper test terminal that is electrically connected in common to the first-side to fourth-side upper test pads,
wherein, when the lower semiconductor structure and the upper semiconductor structure are aligned, the first-side upper test pad, the second-side upper test pad, the third-side upper test pad, and the fourth-side upper test pad overlap with and contact the first-side first lower test pad, the second-side first lower test pad, the third-side first lower test pad, and the fourth-side first lower test pad, respectively, and are spaced apart from the first-side second lower test pad, the second-side second lower test pad, the third-side second lower test pad, and the fourth-side second lower test pad.

20. The semiconductor device of claim 19, wherein, when the lower semiconductor structure and the upper semiconductor structure are aligned, the first-side upper test pad protrudes more than the first-side first lower test pad while crossing the first-side first lower test pad, the second-side upper test pad protrudes more than the second-side first lower test pad while crossing the second-side first lower test pad, the third-side upper test pad protrudes more than the third-side first lower test pad while crossing the third-side first lower test pad, and the fourth-side upper test pad protrudes more than the fourth-side first lower test pad while crossing the fourth-side first lower test pad.

21. The semiconductor device of claim 19, wherein the first-side first lower test pad and the first-side second lower test pad have a long side in a first direction and a short side in a second direction crossing the first direction, where the long sides of the first-side first lower test pad and the first-side second lower test pad are positioned to face each other,
the second-side first lower test pad and the second-side second lower test pad have a short side in the first direction and a long side in the second direction, where the long sides of the second-side first lower test pad and the second-side second lower test pad are positioned to face each other,
the third-side first lower test pad and the third-side second lower test pad have a long side in the first direction and a short side in the second direction, where the long sides of the third-side first lower test pad and the third-side second lower test pad are positioned to face each other, and
the fourth-side first lower test pad and the fourth-side second lower test pad have a short side in the first direction and a long side in the second direction, where the long sides of the fourth-side first lower test pad and the fourth-side second lower test pad are positioned to face each other.

22. The semiconductor device of claim 21, wherein the first-side upper test pad has a long side in the second direction and a short side in the first direction, and the long side of the first-side upper test pad is longer than the short side of the first-side first lower test pad,
the second-side upper test pad has a short side in the second direction and a long side in the first direction, and the long side of the second-side upper test pad is longer than the short side of the second-side first lower test pad,
the third-side upper test pad has a long side in the second direction and a short side in the first direction, and the long side of the third-side upper test pad is longer than the short side of the third-side first lower test pad, and
the fourth-side upper test pad has a short side in the second direction and a long side in the first direction, and the long side of the fourth-side upper test pad is longer than the short side of the fourth-side first lower test pad.

23. The semiconductor device of claim 19, wherein, when the lower semiconductor structure and the upper semiconductor structure are aligned, a current flow between the first-side second lower test terminal and the upper test terminal, a current flow between the second-side second lower test terminal and the upper test terminal, a current flow between the third-side second lower test terminal and the upper test terminal, and a current flow between the fourth-side second lower test terminal and the upper test terminal do not occur.

24. The semiconductor device of claim 19, wherein, when the lower semiconductor structure and the upper semiconductor structure are misaligned, at least one among a contact between the first-side upper test pad and the first-side second lower test pad, a contact between the second-side upper test pad and the second-side second lower test pad, a contact between the third-side upper test pad and the third-side second lower test pad, and a contact between the fourth-side upper test pad and the fourth-side second lower test pad occurs.

25. The semiconductor device of claim 19, wherein, when the lower semiconductor structure and the upper semiconductor structure are misaligned, at least one among a current flow between the first-side second lower test terminal and the upper test terminal, a current flow between the second-side second lower test terminal and the upper test terminal, a current flow between the third-side second lower test terminal and the upper test terminal, and a current flow between the fourth-side second lower test terminal and the upper test terminal occurs.

26. The semiconductor device of claim 19, wherein, in order to determine whether the lower semiconductor structure and the upper semiconductor structure are aligned or not, a first current flow between the first-side second lower test terminal and the upper test terminal, a second current flow between the second-side second lower test terminal and the upper test terminal, a third current flow between the third-side second lower test terminal and the upper test terminal, and a fourth current flow between the fourth-side second lower test terminal and the upper test terminal are detected.

27. The semiconductor device of claim 26, wherein, when the first current flow occurs, a resistance of a path of a first current flowing between the first-side second lower test terminal and the upper test terminal is calculated, when the second current flow occurs, a resistance of a path of a second current flowing between the second-side second lower test terminal and the upper test terminal is calculated, when a third current flow occurs, a resistance of a path of a third current flowing between the third-side second lower test terminal and the upper test terminal is calculated, and when a fourth current flow occurs, a resistance of a path of a fourth current flowing between the fourth-side second lower test terminal and the upper test terminal is calculated.

28. The semiconductor device of claim 27, wherein as the calculated resistance becomes greater, a misalignment extent of between the lower semiconductor structure and the upper semiconductor structure is smaller.

29. The semiconductor device of claim 26, wherein the lower semiconductor structure further includes a first-side first lower test terminal electrically connected to the first-side first lower test pad, a second-side first lower test terminal electrically connected to the second-side first lower test pad, a third-side first lower test terminal electrically connected to the third-side first lower test pad, and a fourth-side first lower test terminal electrically connected to the fourth-side first lower test pad, and wherein, when the first current flow occurs, a resistance of a path of a first current flowing between the first-side first lower test terminal and the upper test terminal is calculated, when the second current flow occurs, a resistance of a path of a second current flowing between the second-side first lower test terminal and the upper test terminal is calculated, when the third current flow occurs, a resistance of a path of a third current flowing between the third-side first lower test terminal and the upper test terminal is calculated, and when the fourth current flow occurs, a resistance of a path of a fourth current flowing between the fourth-side first lower test terminal and the upper test terminal is calculated.

30. The semiconductor device of claim 29, wherein as the calculated resistance becomes greater, a misalignment extent between the lower semiconductor structure and the upper semiconductor structure is greater.

31. The semiconductor device of claim 19, wherein the first to fourth regions are sequentially arranged in a clockwise direction.

* * * * *